United States Patent [19]

Wei et al.

[11] Patent Number: 5,247,298
[45] Date of Patent: Sep. 21, 1993

[54] SELF-LATCHING ANALOG-TO-DIGITAL CONVERTER USING RESONANT TUNNELING DIODES

[75] Inventors: Sen-Jung Wei, Hyattsville; Hung C. Lin, Silver Spring, both of Md.

[73] Assignee: University of Maryland, College Park, Md.

[21] Appl. No.: 850,572

[22] Filed: Mar. 13, 1992

[51] Int. Cl.[5] .............................................. H03M 1/36
[52] U.S. Cl. .................................... 341/133; 341/159
[58] Field of Search ................ 341/133, 155, 158, 159

[56] References Cited

U.S. PATENT DOCUMENTS

3,201,610  8/1965  Ulrich ............................. 341/133 X
5,113,188  5/1992  Kuo et al. ............................ 341/133

*Primary Examiner*—Howard L. Williams

[57] ABSTRACT

A pair of n-peaked resonant tunneling diodes with series resistance are connected in series across a supply voltage to form a digitizer, which has $2n+1$ stable operating points. There are n high current operating points and $n+1$ low current operating points, corresponding to "1" and "0" logic levels. For an n-bit analog-to-digital converter, the analog input voltage is divided into n binary-weighted fractions and applied to n digitizers, which latch the divided voltages into binary currents serving as digital output.

11 Claims, 6 Drawing Sheets

SELF-LATCHING ANALOG-TO-DIGITAL CONVERTER USING RESONANT TUNNELING DIODES

BACKGROUND

In real-time signal processing systems, high speed analog-to-digital converters (ADC) are the primary limiting subsystem. The common method to achieve high speed conversion is to use the flash ADC. This type of ADC conprises a bank of comparators in parallel to compare the input signal with each reference transition level. For an n binary bit ADC, $2^n-1$ comparators are required. For large number of bits, the number of comparators can be excessive for integrated circuits.

Folding and analog encoding techniques have been suggested to reduce the number of comparators. Although these approaches have achieved some degree of improvement in reducing the comparator count, the folding or analog encoding circuits are usually very complex and the frequency response suffers.

The resonant tunneling diode (RTD) is an ultra-high speed device. The switching speed of this device can be less than a picosecond. By stacking a series of RTDs in an integrated structure, one can obtain a multiple peak folding voltage vs current characteristic In a paper by Kuo etal, "A Novel A/D Converter Using Resonant Tunneling Diodes". published in the IEEE Journal of Solid-State Circuits, Vol. 26, No. 2. February 1991, pp146-149, and a copending U.S. patent application Ser. No. 07/391,221, an ADC using RTDs is described. In Kuo's method, a resistance is connected in series with a RTD to change its triangular V-I folding to an unsymmetrical sawtooth V-I characteristic. Then, two RTDs with saw-tooth characteristics are connected together differentially to produce a rectangular folding characteristic. With rectangular folding characteristics, the input voltage is converted either to binary "1" or "0" logic levels. Thus, the input voltage is converted into digital signals without using comparators.

The Kuo circuit, however, has a serious drawback in that the series resistance must exactly match the negative resistance of the RTD to obtain a rectangular folding characteristic. This resistance requirement has caused problems in producing and operating the ADC, because this resistance cannot be controlled accurately in fabrication. Without a rectangular folding charactersitic, the ADC may fail to yield quantized binary digital output. Then, a comparator is required and the major advantage is lost. Further, appropriate offset voltages must be chosen to produce a desired binary output.

Another common practice in ADC design is to incorporate a latch after the comparator. The latch is a regenerative circuit to speed up the transition from one logic level to another logic level. Thus, latching is desirable but is lacking in Kuo's ADC.

SUMMARY

An object of this invention is to implement a simple high speed analog-to-digital converter. Another object is to utilize RTDs to implement high speed analog-to-digital converter. Still another object of this invention is to implement an ADC without using any comparators. A further object of this invention is to implement a high-speed ADC with self-latching action, which is known to speed up up the operation.

These objects are achieved in this invention by connecting two unsymmetrical folding V-I characteristics in series. Such a characteristic is obtained by connecting a resistance in series with an RTD with more symmetrical V-I characteristic. When two unsymmetrical characteristics are connected in series, there can be $1+2n$ stable operating points, where n is the number of peaks of the folding characteristic. Then, there are n numbers of stable high current operating points, say representing logic level "1", and there are $n+1$ low current operating points, say representing logic level "0". Then, these high and low currents represent digital outputs.

DETAILED DESCRIPTION OF THE PREFERRED EMBODIMENT

Figure 1:
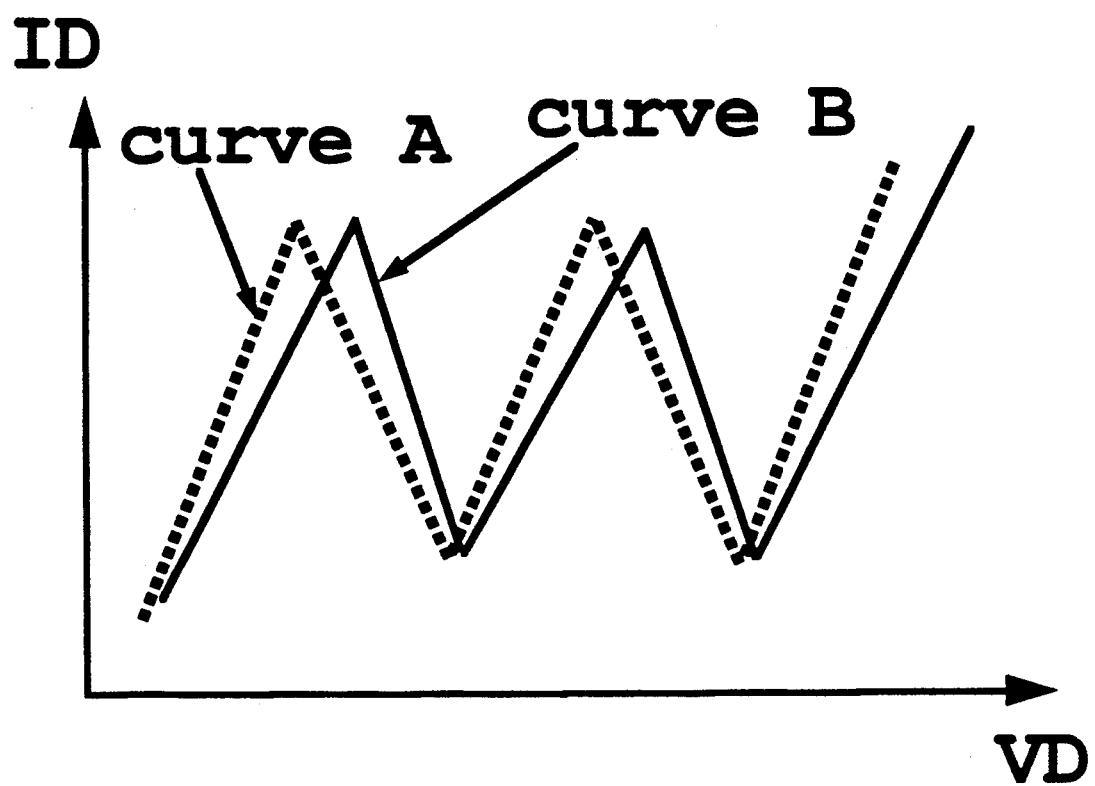
FIG. 1 shows the V-I characteristic of an RTD with and without series resistance.

A multi-peak RTD is a voltage-controlled quantum device with multiple current peaks as a function of applied voltage as shown in curve A of FIG. 1. There are positive and negative resistance regions in this folding characteristic. When a resistance is connected in series with the RTD, the negative resistance can be canceled, and the positive resistance increases. The resultant V-I characteristic becomes unsymmetrical as shown in curve B in FIG. 1.

Figure 2:
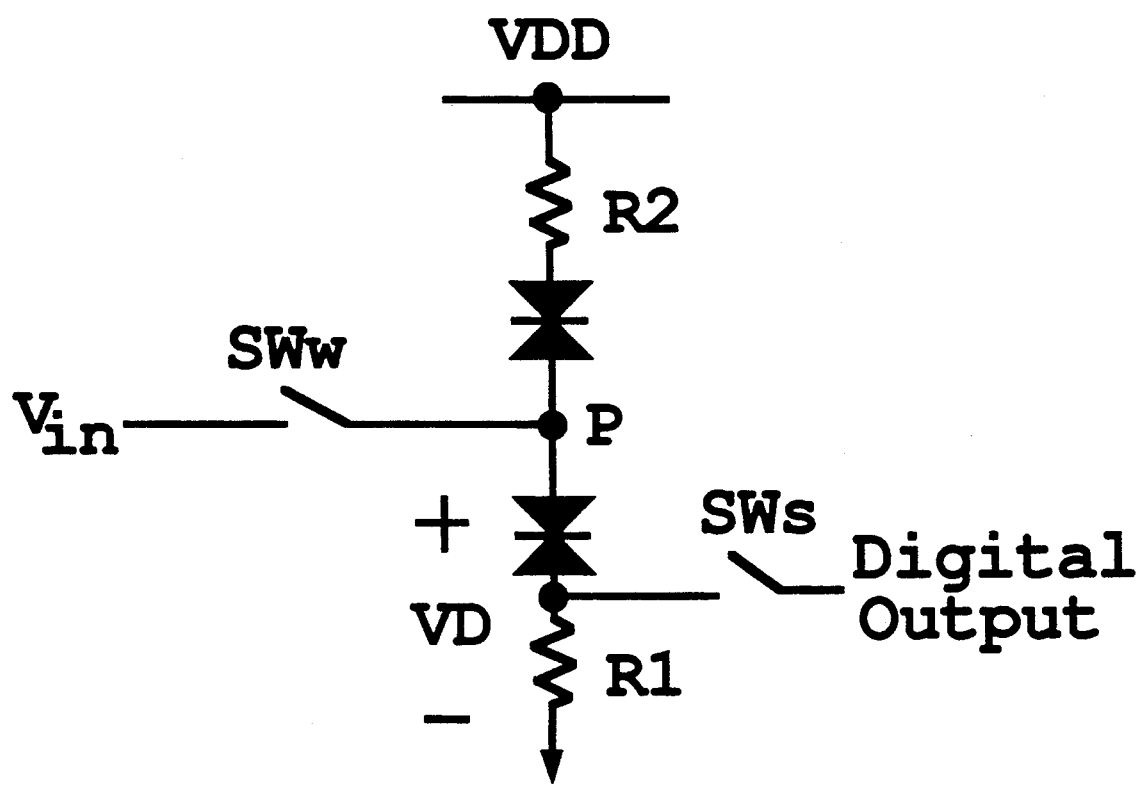
FIG. 2 shows two RTD-resistance combinations connected in series to form a digitizer.
Figure 3:
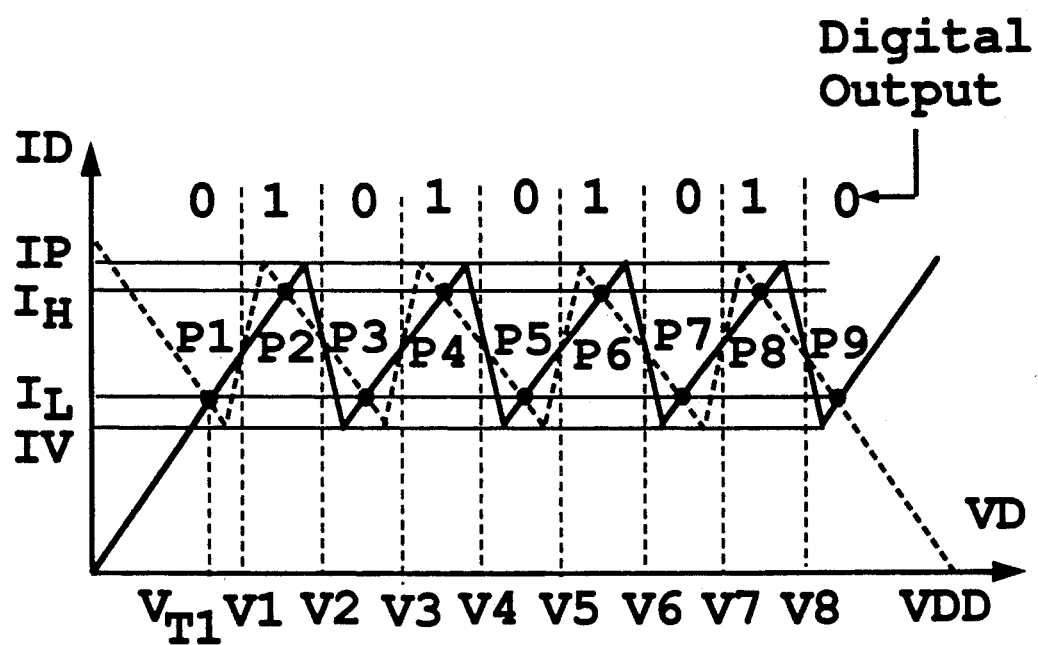
FIG. 3 shows the stable operating points of the circuit shown in FIG. 2.

When two such RTD-resistance composite devices, RTD/R1 and RTD/R2, are connected in series as shown in FIG. 2, a digitizer is formed. The stable operating points of this circuit can be determined graphically as shown in FIG. 3 by plotting the V-I characteristic of RTD/R2 as the load line in dotted line and the V-I characteristic of RTD/R1 as the driver in solid line. The stable operating points are located where the positive resistance regions intersect. When the supply voltage is properly chosen, there can be $2n+1$ stable operating points. As shown in FIG. 3, each composite device has four peaks and there are nine stable states, P1 through P9.

In operation, an analog input voltage Vin is fed to the junction P of RTD/R1 and RTD/R2 through a sampling switch SWw. After SWw is off, the voltage of node P settles to the nearest stable operating point. Let V1, V2 ... V8 be the voltages where the negative resistance sections intersect. For $Vin \leq V1$, the operating point settles at P1. For $V_n < Vin \leq V_{n+1}$, the operating point settles at $P_{n+1}$, where $1 \leq n \leq 7$. For $Vin > V8$, the operating point settles at P9.

The settling action can be explained in terms of the charging and discharging of any node capacitance at the junction P. The capacitance is charged by the load device RTD/R2 and discharged by the driver RTD/R1. If the initial junction voltage is slightly larger than V2, the charging current is higher than the discharging current. Thus, the node capacitance is charged up to P3, where the charging and discharging currents are equal. Since the node capacitance of an RTD is very small, the settling process is very fast. This process is equivalent to a latching action in that the operating point does not stay in the initial condition but settles quickly to the final condition.

Afterwards, the sense switch SWs is turned on to sense the digital output level. The bias current for P2, P4, P6 and P8 is high at $I_H$, and that for P1, P3, P5, P7 and P9 is low at $I_L$. Thus, the settling currents alternate between $I_H$ and $I_L$ in response to increasing Vin. If $I_H$ is taken as binary logic level "1" and $I_L$ is taken as binary logic level "0", then the circuit becomes a multi-threshold binary digitizer. With this basic building block, an n-bit ADC can be formed.

Figure 4:
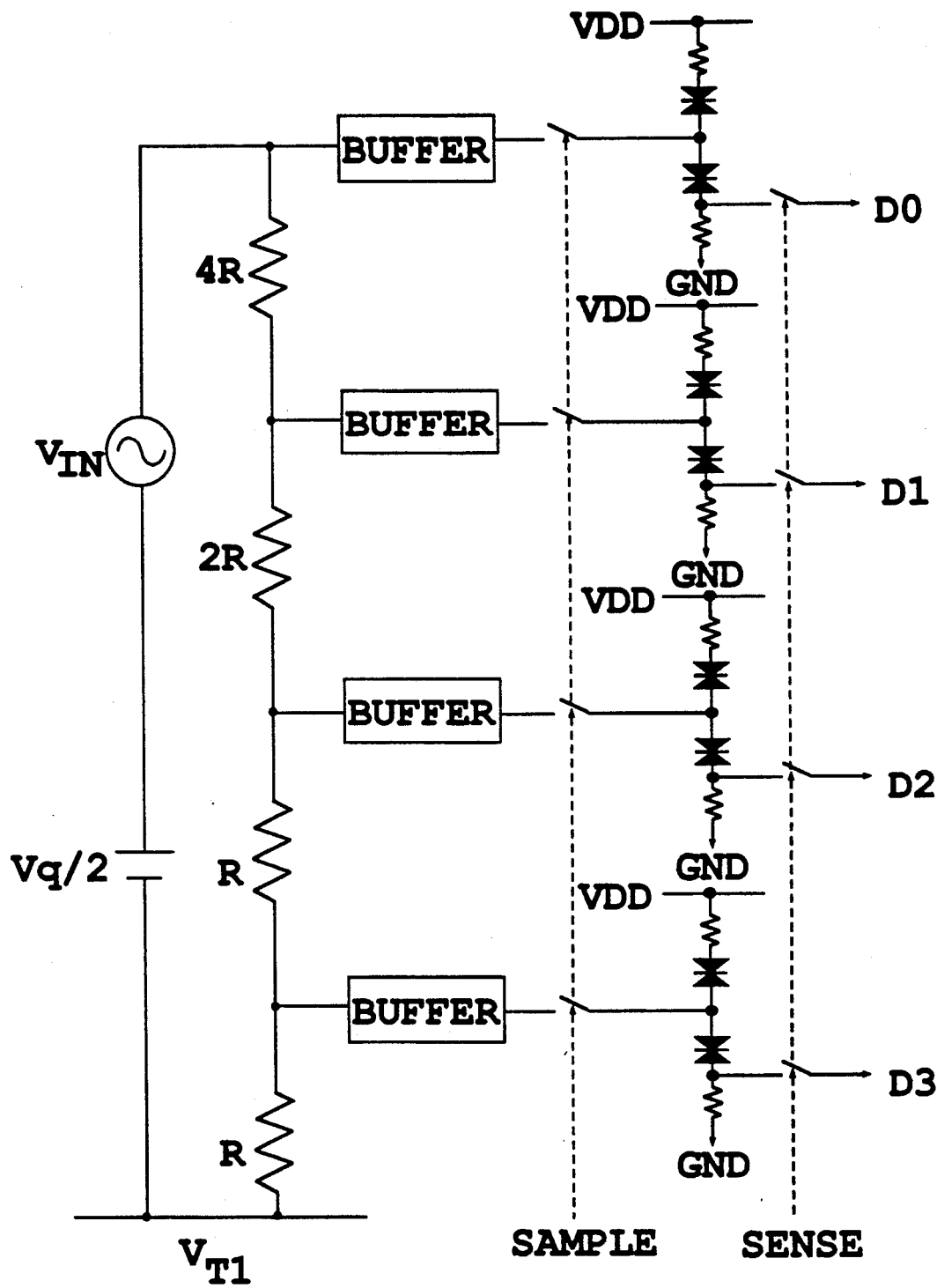
FIG. 4 shows a 4-bit A/D converter using RTDs according to this invention.
Figure 5:
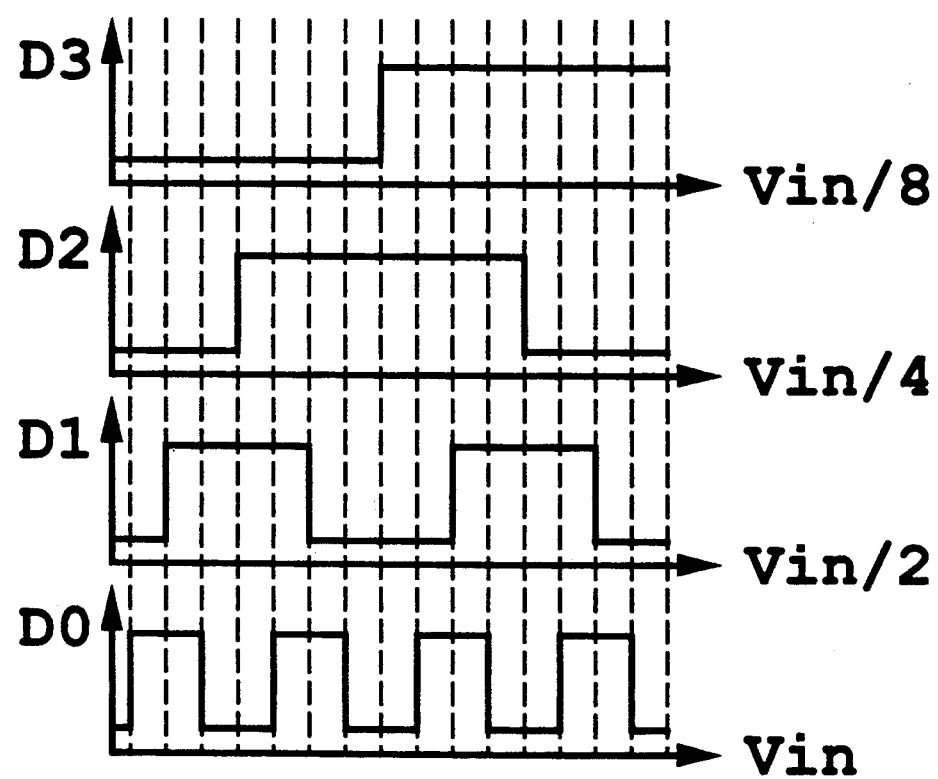
FIG. 5 shows the transfer curves for different binary-weighted fraction of input voltage.

FIG. 4 shows the circuit diagram of the analog-to-digital converter in this invention, using the digitizer shown in FIG. 2 as the basic element. The voltage Vin+Vq/2, where Vq is the quantization step, is offset by $V_{T1}$, which is the node voltage P1 in FIG. 3. The purpose of offsetting Vin by Vq/2 is to transfer the quantization error from $0\pm1$ least significant bit (LSB) to $\pm$one half LSB. D0, D1, D2 and D3 are the digital outputs of binary weighted fractions of input voltage Vin, Vin/2, Vin/4 and Vin/8 respectively. The transfer curves for each digitized output vs input are shown in FIG. 5. These digital outputs are in the form of high and low currents $I_H$ and $I_L$ as shown in FIG. 3, and then converted into voltages by measuring the voltages across R1's in the drivers RTD/R1s.

Figure 6:
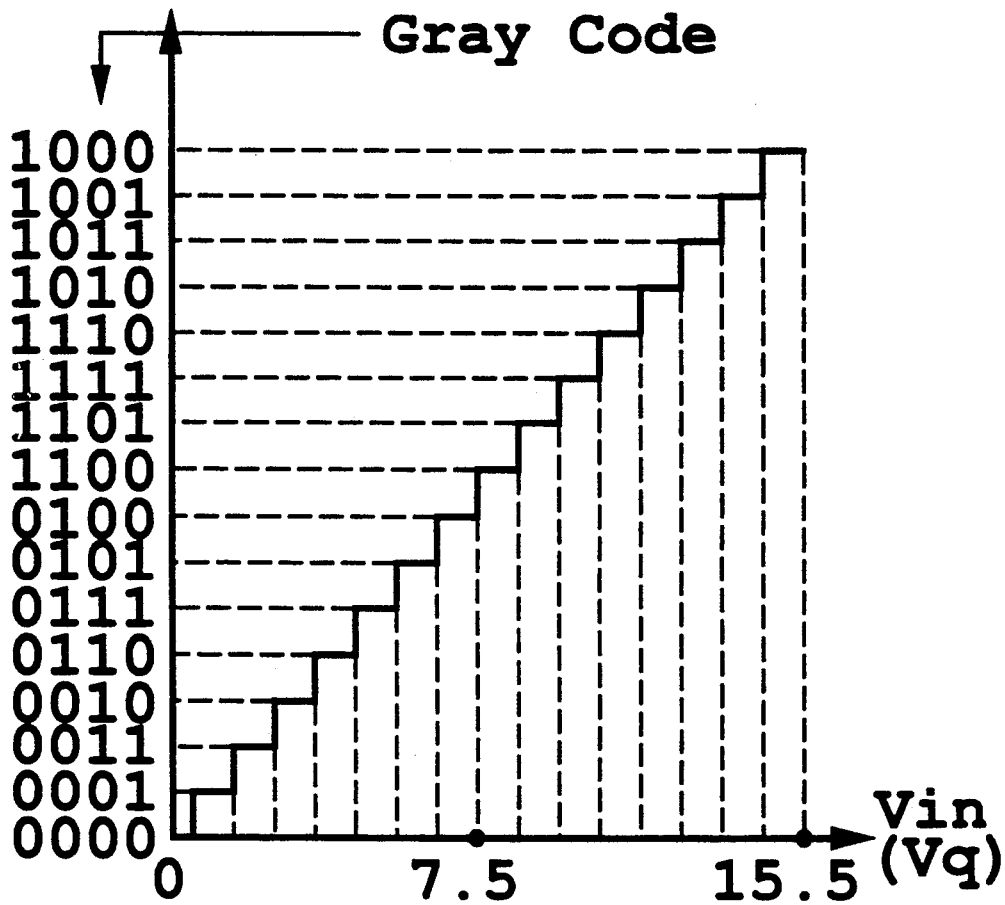
FIG. 6 shows the output vs input voltage transfer characteristic of a 4-bit A/D converter.

FIG. 6 is the combined transfer curve of the ADC. The sampling and sensing switches are controlled by non-overlapping clocks. The digital outputs D0 to D3 are obtained at the end of the sensing phase.

What is claimed is:

1. An n-bit analog-to-digital converter, where n is an integer number larger than one, having analog input voltage comprising:
    n-numbered digitizers each having a series connection of two devices of unsymmetrical folding V-I characteristics connected between positive and negative terminals of a supply voltage,
    each one of said devices having n+1 positive resistance sections with positive differential resistance and n negative resistance sections with negative differential resistance,
    said positive differential resistance having a magnitude larger than that of said negative differential resistance,
    said supply voltgae being adjusted to produce two operating points of a high current and a low current along each one of the first n sections of said positive resistance sections as a function of the joint voltage at the joint of said two devices,
    said high current representing one binary logic level,
    said low current representing another binary logic level,
    a voltage divider to divide said analog input voltage into n-numbered divided voltages with reference to one of said terminals of said supply voltage,
    means for applying said divided voltages to each of said joints of said digitizers for triggering said digitizers to settle at one of said two operating points in said positive resistance sections by the latching action of charging and discharging the node capacitance at the joints though said two devices,
    means for sensing said high current and said low current to produce digital signals.

2. An n-bit analog-to-digital converter as described in claim 1, wherein said folding V-I characteristic has n-number of peaks.

3. An n-bit analog-to-digital converter as described in claim 2, wherein each of said digitizers has n-numbered said high currents and (n+1) said low currents.

4. An n-bit analog-to-digital converter as described in claim 1, wherein each one of said devices with unsymmetrical folding V-I characteristic comprises a resistance in series with another device with more symmetrical folding V-I characteristic than said unsymmetrical folding V-I characteristic.

5. An n-bit analog-to-digital converter as described in claim 4, wherein said another device is a resonant tunneling diode (RTD).

6. An n-bit analog-to-digital converter as described in claim 1, wherein each one of said digitizers is inputted with one of said divided voltages equal to a binary-weighted fraction of said analog input voltage.

7. An n-bit analog-to-digital converter as described in claim 4, wherein said means for sensing is said resistance.

8. An n-bit anolog-to-digital converter as described in claim 7, wherein said resistance is connected to said negative terminal of supply voltage.

9. An n-bit analog-to-digital converter as described in claim 1, wherein said means for applying said divided voltages is a sampling switch.

10. An n-bit analog-to-digital converter as described in claim 1, wherein said digital signals are sensed through sensing switches.

11. An n-bit analog-to-digital converter as described in claim 1, wherein said means for applying said divided voltages is a first set of sampling switches controlled by a first clock signal; each said digital signal is sensed through a second set of sensing switches and controlled by a second clock signal, which is non-overlapping with said first clock signal.

* * * * *